(12) United States Patent
Berthelot et al.

(10) Patent No.: US 8,865,564 B2
(45) Date of Patent: Oct. 21, 2014

(54) PROCESS FOR PRODUCING VERTICAL INTERCONNECTIONS THROUGH STRUCTURED LAYERS

(75) Inventors: Audrey Berthelot, St Ismier (FR); Jean-Philippe Polizzi, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 290 days.

(21) Appl. No.: 13/413,909

(22) Filed: Mar. 7, 2012

(65) Prior Publication Data
US 2012/0231624 A1 Sep. 13, 2012

(30) Foreign Application Priority Data

Mar. 9, 2011 (FR) ...................................... 11 00701

(51) Int. Cl.
| | |
|---|---|
| *H01L 21/46* | (2006.01) |
| *H01L 21/30* | (2006.01) |
| *H01L 21/768* | (2006.01) |
| *H01L 23/48* | (2006.01) |
| *B81C 1/00* | (2006.01) |

(52) U.S. Cl.
CPC . *H01L 21/76898* (2013.01); *H01L 2224/80001* (2013.01); *H01L 23/481* (2013.01); *B81C 1/00095* (2013.01)
USPC ........... 438/455; 438/456; 438/619; 438/622; 438/669; 438/672; 257/621; 257/E21.602

(58) Field of Classification Search
None
See application file for complete search history.

(56) References Cited

U.S. PATENT DOCUMENTS

| | | | | |
|---|---|---|---|---|
| 6,399,516 B1 * | 6/2002 | Ayon | ............................. | 438/739 |
| 6,566,232 B1 * | 5/2003 | Hara et al. | ..................... | 438/455 |
| 6,642,081 B1 * | 11/2003 | Patti | .............................. | 438/109 |
| 7,488,630 B2 * | 2/2009 | Frank et al. | ................... | 438/149 |
| 8,124,521 B2 * | 2/2012 | Hedler et al. | ................. | 438/618 |
| 2008/0083976 A1 | 4/2008 | Haba et al. | | |
| 2010/0155932 A1 | 6/2010 | Gambino et al. | | |
| 2010/0244251 A1 | 9/2010 | Torazawa et al. | | |

FOREIGN PATENT DOCUMENTS

FR 2 928 225 A1 9/2009

OTHER PUBLICATIONS

International Search Report for French Application No. 1100701 dated Oct. 12, 2011.

* cited by examiner

*Primary Examiner* — Zandra Smith
*Assistant Examiner* — Khanh Duong
(74) *Attorney, Agent, or Firm* — Alston & Bird LLP

(57) ABSTRACT

A process is provided for producing at least one interconnecting well to achieve a conductive pathway between at least two connection layers of a component comprising a stack of at least one first substrate and one second substrate which are electrically insulated from one another, the process including defining a surface contact region of a surface connection layer over a surface of the stack and of at least one first contact region embedded in the stack starting from a first embedded connection layer of the first substrate. A region devoid of material is positioned between the first substrate and second substrates and which comprises a stage of producing a interconnecting well which passes through the second substrate and extends between the surface contact region and the first embedded contact region and passes through the region devoid of material, and also a first layer which covers the first embedded connection layer.

20 Claims, 5 Drawing Sheets

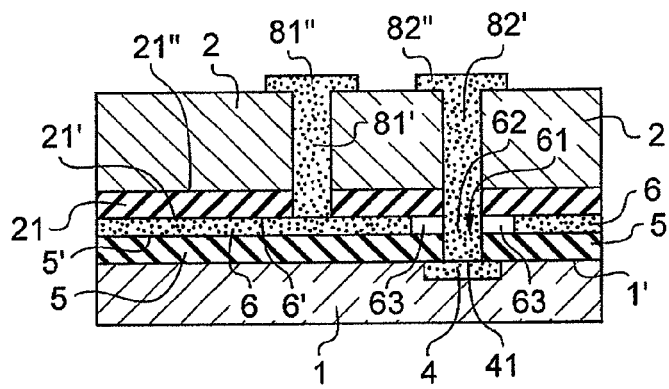
Fig. 2g
Fig. 3a
Fig. 3b
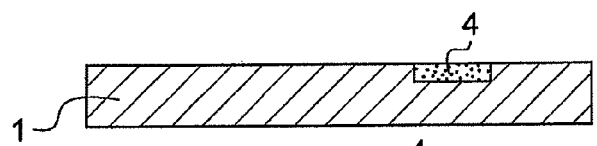
Fig. 3c
Fig. 3d
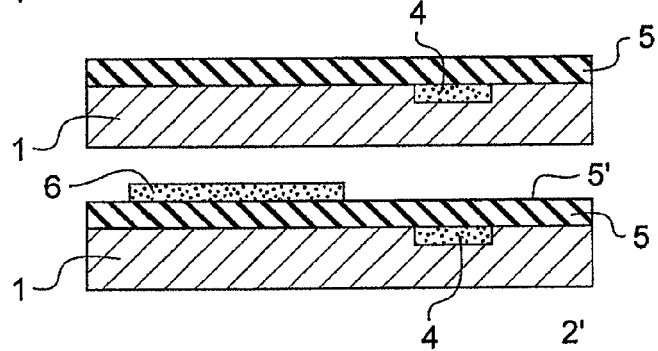
Fig. 3e
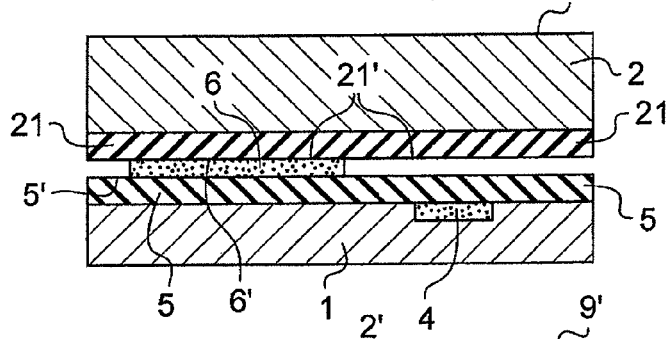
Fig. 3f
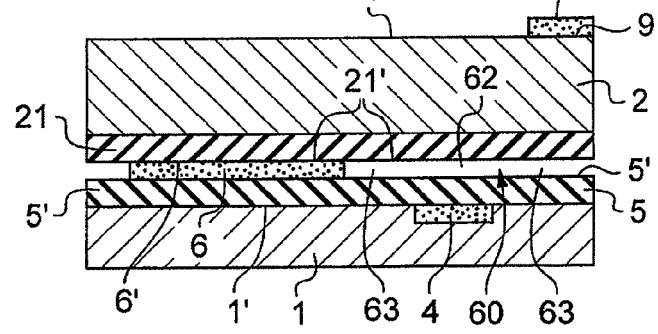

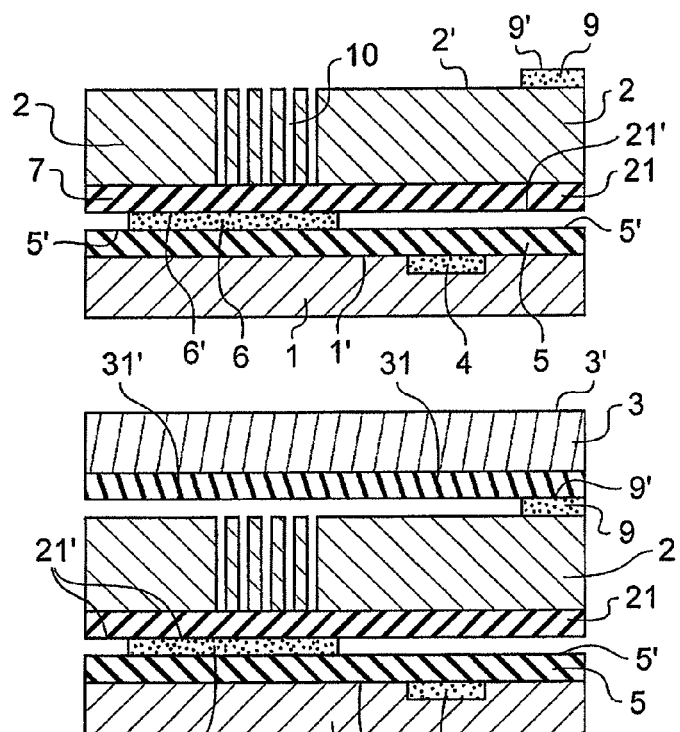
Fig. 3g
Fig. 3h
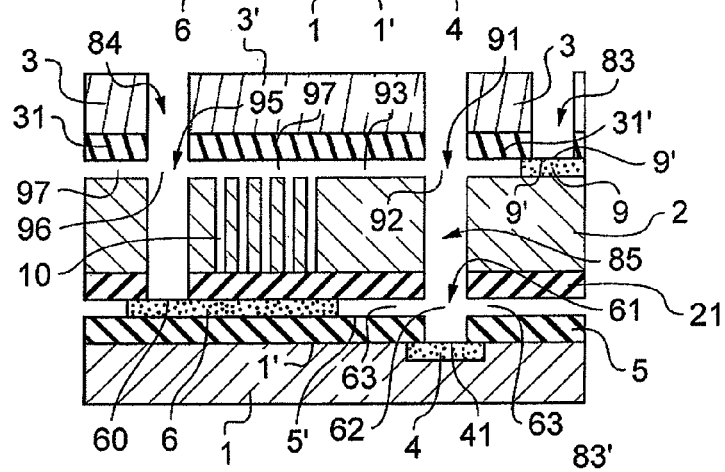
Fig. 3i
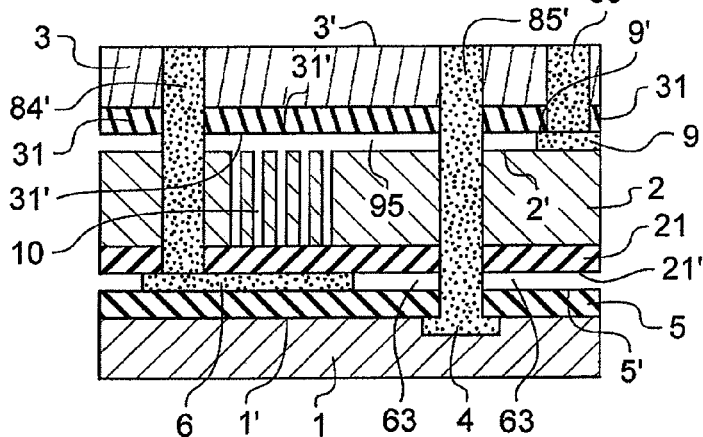
Fig. 3j

PROCESS FOR PRODUCING VERTICAL INTERCONNECTIONS THROUGH STRUCTURED LAYERS

FIELD

A subject matter of the present invention is a process for producing at least one interconnecting well for the purpose of producing interconnections or pathways in a component comprising at least two substrates.

BACKGROUND

Component is understood to mean any device performing at least one function, electrical and/or mechanical and/or chemical, and comprising electrical interfaces.

An interconnection or pathway makes it possible to electrically connect, to the surface of the component, contact regions situated in one or more connection layers embedded at different levels.

In the known processes, interconnections or pathways are produced by successive stages, in a proportion of a stage of producing, through the substrates (or through an insulating layer, in the case where two interconnection layers are separated only by an insulating layer), passage regions, followed by a stage of filling the latter, for each interconnection layer, as the stack is produced, the interconnection layers being situated at different levels of the stack.

In other words, in the case of three connection layers, at least one passage region is produced for the conductive pattern or patterns of the first connection layer, which is filled with a conductive material in order to form an interconnecting section forming a portion of the interconnection.

Subsequently, for the second connection layer, there is produced, through an insulating layer which separates the first and the second connection layers or through the second substrate, at least one passage region for the conductive pattern or patterns of the second connection layer and also at least one passage region for extending the portion of the pathway towards the first connection layer, and so on for the third substrate.

Thus, similar stages are repeated several times during the manufacture, in order to produce the interconnections by sections, which increases in proportion the manufacturing costs.

SUMMARY

The present invention proposes to overcome this disadvantage by virtue of a process which makes it possible to produce, in just one stage, at least two sections of an interconnection.

The basic idea of the invention is that, during the etching of a well, the route of which passes through a space devoid of material, the ions of the etching plasma pass through this space without being slowed down, halted or deflected and that, beyond this space, the etching of the well can be continued while retaining its cross-section.

The invention thus relates to a process for producing at least one interconnecting well intended to make possible the achievement of a conductive pathway between at least two connection layers of a component comprising a stack of at least one first substrate and one second substrate which are electrically insulated from one another, the process comprising the definition of at least one surface contact region of a surface connection layer over a surface of the stack and of at least one first contact region embedded in the stack starting from a first embedded connection layer of the first substrate, wherein at least one region devoid of material is positioned between the first substrate and the second substrate and which comprises a stage of producing, by plasma etching starting from said surface of the stack, at least one first interconnecting well which passes through at least the second substrate and which extends between the surface contact region and the first embedded contact region and which passes through the region devoid of material, and also a first insulating layer which covers the first embedded connection layer.

As a characteristic feature, the process may comprise a stage of filling the interconnecting well with a conductive material in order to form a conductive pathway and a stage of producing said surface connection layer, the conductive pathway electrically connecting, via the said contact regions thereof, the first embedded connection layer to the surface connection layer.

A possible characteristic feature of the process is that the first connection layer is put into a surface of the first substrate on which said first insulating layer is subsequently deposited and that it comprises the following stages:

a) after the deposition of the first insulating layer, depositing, on the latter, at least one second embedded connection layer comprising a second embedded contact region, leaving free at least one first region devoid of material for the passage of a conductive pathway intended for the first embedded contact region of the first embedded connection layer, b) rendering the second embedded connection layer integral with the second semiconducting substrate via a second insulating layer, c) producing at least said first interconnecting well and, simultaneously, optionally a second interconnecting well extending from said surface of the stack as far as a contact region of the second embedded connection layer.

Stage c can be carried out starting from the surface of the second substrate, opposite that in contact with the second insulating layer.

The second insulating layer may not form part of the second substrate and may be deposited before the transfer of the second substrate.

Alternatively, the process may comprise, between b and c:

b1) producing, at the surface of the second substrate in contact with said surface of the second insulating layer, at least one third connection layer, leaving free at least one region devoid of material situated vertically above the embedded contact regions of each of the first and second connection layers, b2) rendering the third connection level integral with a third substrate via a third insulating layer.

Stage c) preferably comprises the simultaneous production of at least one first interconnecting well, one second interconnecting well and/or one third interconnecting well for at least one of the first, second and third contact regions.

Stage c can be carried out starting from a surface of the third substrate, opposite that in contact with said third insulating layer.

The third insulating layer may not form part of the third substrate and may be deposited before the transfer of the third substrate.

In the case of a structure employing three substrates, there may also be only a single embedded connection layer (and not two) between the first substrate and the second substrate, and an embedded connection layer between the second substrate and the third substrate.

A possible characteristic feature of the process is then that the first embedded connection layer is put into a surface of the first substrate on which the first insulating layer is subsequently deposited and that it comprises the following stages:

a') rendering the first insulating layer integral with a first surface of a second substrate, b'1) producing, at the surface of the second substrate opposite its first surface, a second embedded connection layer, leaving free at least one region devoid of material situated vertically above the embedded contact region of the first embedded connection layer, b'2) rendering the second connection layer integral with a third substrate via a third insulating layer and c') producing at least the first interconnecting well and, simultaneously, optionally a second interconnecting well extending from the surface of the stack as far as the second embedded contact region.

Stage c' can be carried out starting from a surface of the third substrate, opposite that in contact with said third insulating layer.

The substrates are preferably rendered integral by direct bonding.

At least one stage of rendering integral (in particular b, b2, a' or b'2) can be carried out by direct bonding.

A possible characteristic feature of the process is that at least one region devoid of material exhibits a region devoid of material which surrounds the passage of an interconnecting well.

A possible characteristic feature of the process is that at least one region devoid of material is bordered at its periphery by a conductive region surrounding the passage of an interconnecting well. This conductive region may thus be electrically insulated before the filling stage. This conductive region forms, for example, an electrically insulated ring.

The process preferably comprises a single stage of filling the interconnecting wells with an electrically conductive material in order to produce said interconnections.

The process can comprise a stage of formation of conductive regions in order to produce contact regions on the interconnections.

BRIEF DESCRIPTION OF THE DRAWINGS

A better understanding of the invention will be obtained on reading the following description, in connection with the drawings, in which:

FIGS. 2a to 2g illustrate an implementation of the invention in the case of two connection levels separated by an insulating layer, FIGS. 3a to 3k illustrate a preferred implementation of the invention with three substrates and three connection levels.

DETAILED DESCRIPTION

Figure 1A:
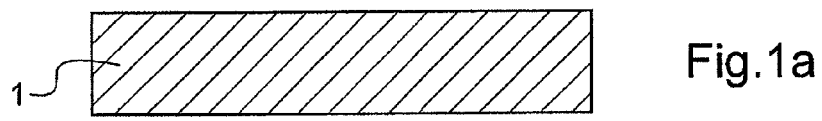
FIGS. 1a to 1f illustrate an implementation of the invention in the case of a pathway between the surface of a stack comprising two substrates and an embedded connection layer.
Figure 1B:
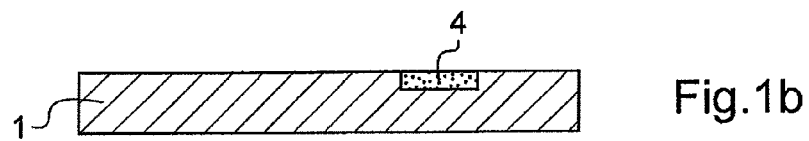
Figure 1C:
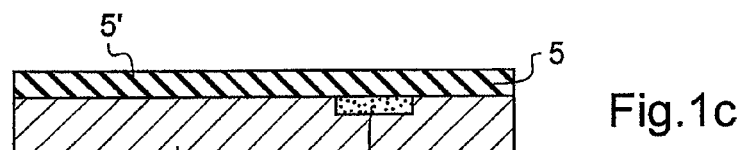
Figure 1D:
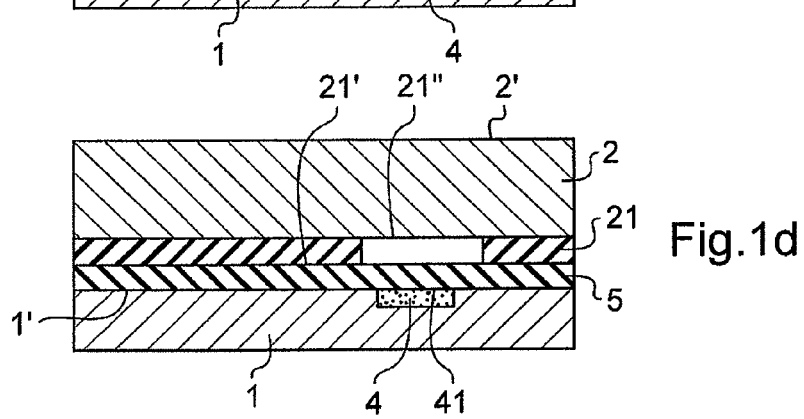
Figure 1E:
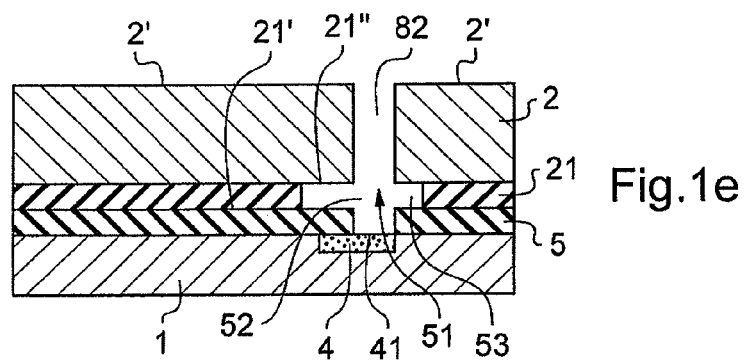

FIGS. 2a to 2g illustrate an implementation of the invention with a component comprising two substrates 1 and 2.

FIGS. 1a to 1f illustrate an implementation of the invention with a component comprising a stack of two substrates 1 and 2 and an interconnection between an embedded connection layer 4 and the surface of the stack, which is in this instance the surface 2' of the substrate 2.

The starting point is a substrate 1 (FIG. 1a), for example made of Si or else made of Si covered with an insulating layer. An embedded connection layer exhibiting at least one conductive pattern 4 (first connection layer) is obtained by doping or etching and then filling with a conductive material (FIG. 1b) in the surface 1' of the substrate 1 (or is produced at the surface of this).

An insulating layer 5 (FIG. 1c) is subsequently deposited on the surface 1', so as to cover at least the perimeter of the conductive pattern 4.

The second substrate 2 exhibits an insulating layer 21 which coats its surface 21". The insulating layer 21 exhibits a reserve 51 devoid of material. It comprises a central region 52 which is vertically above the contact region 41 of the conductive layer 4 and a peripheral region 53 which completely surrounds the central region 52.

The surface 21' of the insulating layer 21 of the second substrate 2 is the surface which is subsequently rendered integral (FIG. 1d) with the surface 5' of the insulating layer 5.

At least one well 82 is subsequently etched by plasma etching (FIG. 1e), which well passes through the substrate 2, the insulating layer 21, the reserve devoid of material and the insulating layer 5 until it reaches at least one electrical contact region 41 of the conductive pattern 4. The outline of the contact region 41 is delimited by the well 82 and is the same as that of the central region 52 situated vertically above the region 41. There remains, around this central region 52, a peripheral region 53 devoid of material.

Figure 1F:
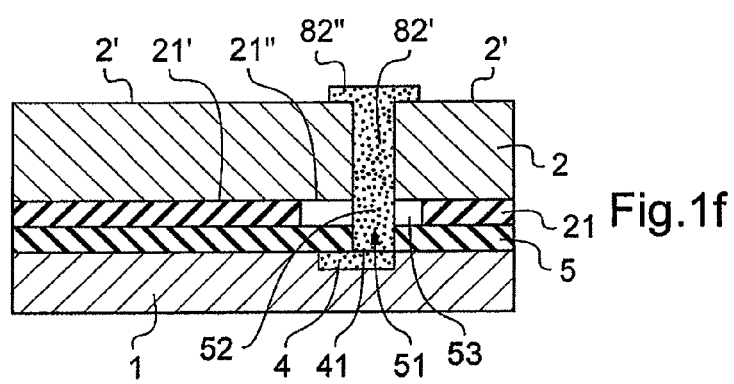

Subsequently, the well 82 is filled with a conductive material which is subsequently planarized, for example doped polysilicon or else metal, in particular AlCu, Al, Cu or W, to produce the interconnection or pathway 82' (FIG. 1f). The deposition processes can vary (LPCVD, CVD, epitaxy, and the like). It is possible to subsequently produce, at the free surface 2' of the substrate 2, a surface connection layer 82" which makes possible an electrical contact for the interconnection 82'.

The etching of the well 82 can be carried out conventionally by plasma etching, with two different plasmas, one for attacking the substrate, generally Si (plasma, for example HBr/Cl2/O2 or SF6), and the other for attacking the insulating layer, generally SiO2 (plasma, for example C4F8/Co/O2). The conductive material serves as stop layer.

During the etching of the well 82, the ions of the plasma freely pass through the central region 52 of the reserve 51 without being slowed down, halted or deflected to reach the contact region 41 by etching through the insulating layer 5. The cross-section of the well 82 is retained during the etching through the insulating layer.

In the following example, which comprises two embedded connection levels, the starting point is a substrate 1 (FIG. 2a), for example made of Si. A connection layer exhibiting at least one conductive pattern 4 (first connection layer) is obtained by doping or etching and then filling with a conductive material (FIG. 2b) in the surface 1' of the substrate 1 (or is produced at the surface of this).

A first insulating layer 5 (FIG. 2c) is subsequently deposited on the surface 1' so as to cover at least the perimeter of the conductive pattern 4. The insulating layer might be interrupted above the first conductive layer.

At least one embedded conductive pattern 6, which defines a second embedded connection layer (FIG. 2d) which exhibits a second embedded contact region 60, is subsequently produced at the surface 5' of the insulating layer 5, which now constitutes a surface of the substrate 1, a reserve 61 devoid of material being put in.

This reserve 61 comprises a central region 62, which is vertically above the electrical contact region 41 of the conductive layer 4, and a peripheral region 63 which completely surrounds the central region 62.

The second substrate 2 exhibits an insulating layer 21 which coats its surface 21". The surface 21' of the insulating layer 21 of the second substrate 2 is subsequently rendered integral (FIG. 2e) with the surface 6' of the conductive pattern 6 (second connection level). This process of rendering integral can be carried out by direct bonding.

Figure 2A:
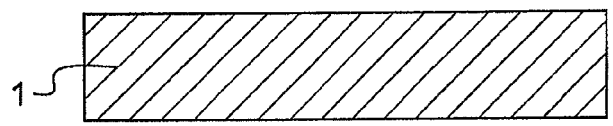
Figure 2B:
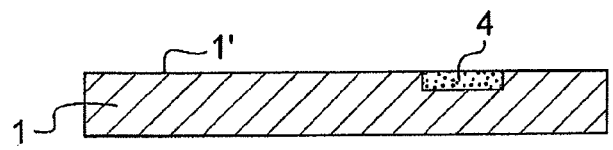
Figure 2C:
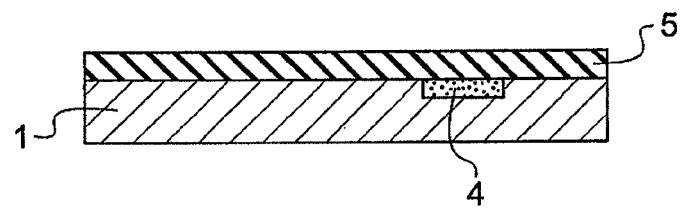
Figure 2D:
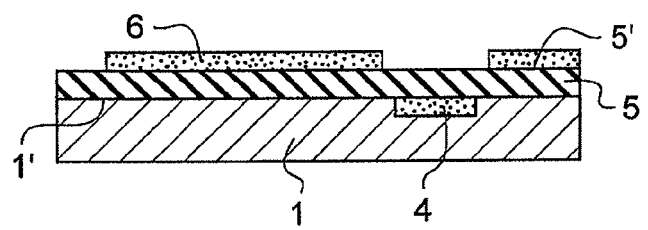
Figure 2E:
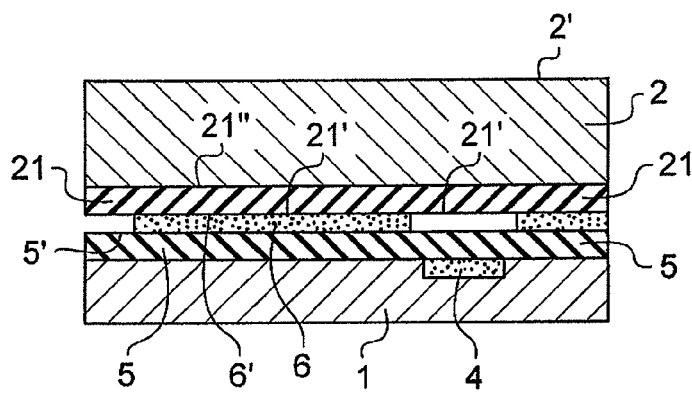
Figure 2F:
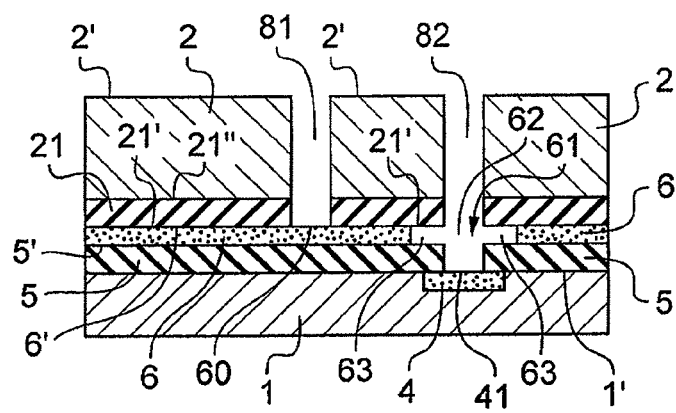
Figure 3K:
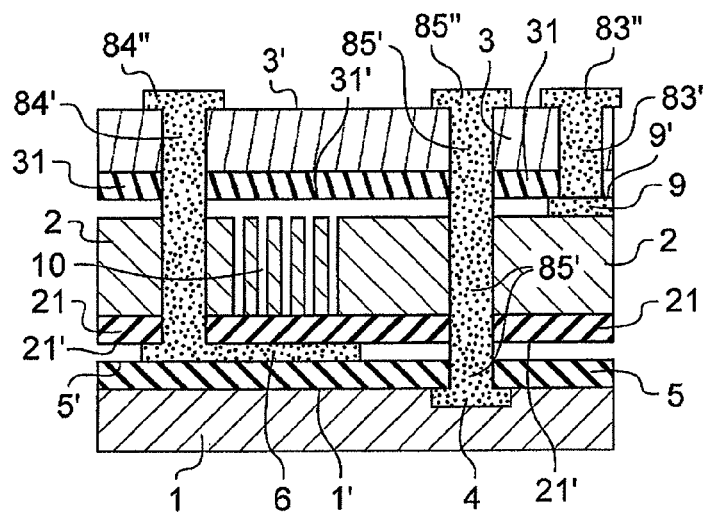

Subsequently, at least one well 81, which passes through the substrate 2 and the insulating layer 21 until at least one contact region 60 of at least one conductive pattern 6 is reached, and at least one well 82, which passes through the substrate 2, the insulating layer 21 and the insulating layer 5 until at least one contact region 41 of at least one conductive pattern 4, the outline of which is delimited by the well 82 and is the same as that of the central region 62 situated vertically above the region 41, is reached, are simultaneously etched by plasma etching (FIG. 2f).

It should be noted that only the well 82 may be produced, in particular in the case where the embedded conductive pattern 6 is not intended to be connected to the surface of the stack.

Subsequently, the wells 81 and 82 are filled with a conductive material which is subsequently planarized, for example doped polysilicon or metal, in particular AlCu, Au, Cu or W, to produce interconnections or pathways 81' and 82' respectively (FIG. 1g). The deposition processes can be varied (LPCVD, CVD, epitaxy, and the like). It is subsequently possible to produce, at the free surface 2' of the substrate, surface connection layers 81" and 82" which make possible an electrical contact for each of the interconnections.

The peripheral region 63 makes it possible to provide the electrical insulation between, on the one hand, the conductive material of the interconnection 82' which fills the well 82, taking into account the possible lateral propagation of said conductive material, and, on the other hand, the embedded conductive pattern 6.

The etching of the wells can be carried out conventionally by plasma etching, with two different plasmas, one for attacking the substrate, generally Si (plasma, for example HBr/Cl2/O2 or SF6), and the other for attacking the insulating layer, generally SiO2 (plasma, for example C4F8/CO/O2). The conductive material serves as stop layer.

During the etching of the well 82, the ions of the plasma freely pass through the central region 62 without being slowed down, halted or deflected to reach the contact region 41 by etching through the insulating layer 5. The cross-section of the well 82 is retained during the etching through the insulating layer.

FIGS. 3a to 3k illustrate a preferred embodiment of the process according to the invention in the case of a microelectromechanical system ("MEMS").

The stages illustrated by FIGS. 3a to 3e are the same as the stages illustrated by FIGS. 2a to 2e, apart from the form of the conductive patterns (second connection level).

The process is continued (FIG. 3f) by the deposition of a third connection layer exhibiting at least one conductive pattern 9 at the surface 2' of the substrate 2.

This pattern 9 can be deposited at any point desired on the surface, with the exception of the regions 91 and 95 intended for the passage of the wells 84 and 85 which subsequently define the interconnections toward the patterns 6 and 4.

Thus it is that the region 91 (well 85) comprises a central region 92, which overhangs the contact region 4, and a peripheral region, which entirely surrounds it, and that the region 95 (well 84) comprises a central region 96, which overhangs the contact region 6, and a peripheral region 97 (see FIG. 3i).

Subsequently, a mechanical structure 10 for the microelectromechanical system (MEMS) is produced in the substrate 2 (FIG. 3g) in a known way.

Subsequently, a substrate 3 provided with an insulating layer 31, which will cover the connection layer exhibiting one or more conductive patterns 9, is subsequently added. The surface 31' of the third substrate 3 (which is the surface of the insulating layer 31) is rendered integral with the surface 9' of the conductive pattern 9, for example by direct bonding.

Subsequently, wells 83, 84 and 85, which respectively reach the conductive pattern or patterns 9 through successively the substrate 3 and the insulating layer 31, the conductive pattern or patterns 6 through successively the substrate 3, the insulating layer 31, the substrate 2 and the insulating layer 21 and, finally, the conductive pattern or patterns 4 through successively the substrate 3, the insulating layer 31, the substrate 2 and the insulating layers 21 and 5, are produced (FIG. 3i).

Subsequently, the wells 83, 84 and 85 are filled (FIG. 3j) with a conductive material in order to form the interconnections 83', 84' and 85' which make it possible to electrically connect the conductive patterns 4, 6 and 9, starting from the surface 3' of the substrate 3, on which are subsequently deposited, for this purpose, the contact regions 83", 84" and 85" (FIG. 3k) in order to form electrical contacts.

The peripheral regions 63, 93 and 97 are given dimensions in order to avoid short circuits with the regions 6 and 9 by the conductive material which defines the interconnections 83', 84' and 85'.

Figure 4:
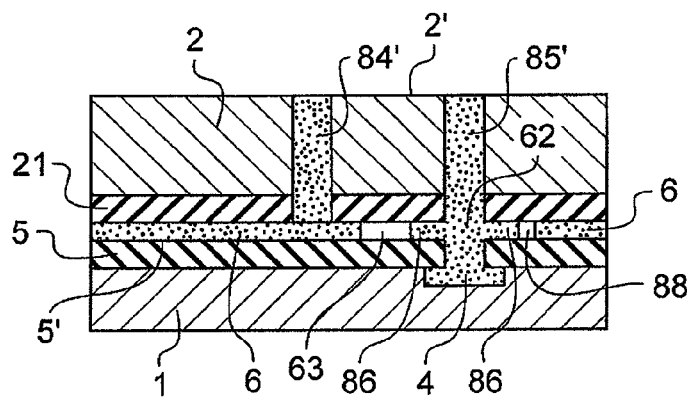
FIG. 4 illustrates the lateral propagation of the material for filling the wells.

This is because, during the simultaneous production of these interconnections, the conductive material tends to spread laterally, as illustrated in FIG. 4. The region 62 has the same cross-section as the well 85. The region 63 which surrounds it has to be provided with sufficient width for the material 86 overflowing peripherally to remain separated from the conductive pattern 6 by a space devoid of material 88 in order to prevent any short circuit.

Figure 5A:
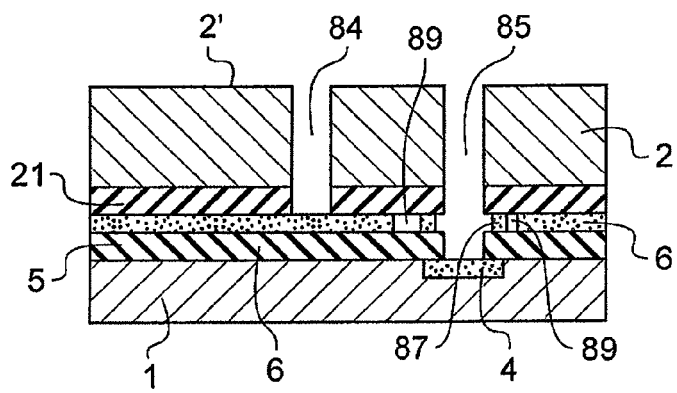
FIGS. 5a and 5b illustrate the implementation of confinement walls in order to prevent such a lateral propagation and the risk of short circuit pertaining thereto.
Figure 5B:
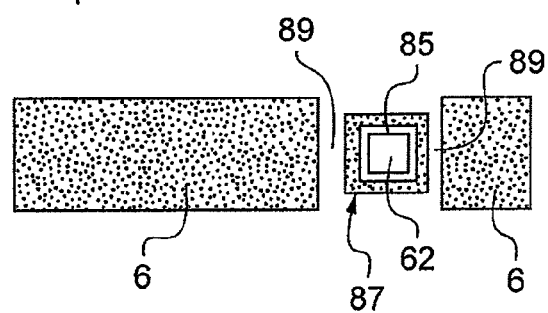

A solution which makes it possible to overcome the problem of the lateral overflowing of the conductive material which fills the wells is illustrated in FIGS. 5a and 5b.

It concerns surrounding the central region, for example 62, with a conductive containment ring 87 which serves as stop layer. This conductive ring 87 is separated from the conductive pattern (in this instance 6) by an empty space 89 in order to prevent short circuits.

This solution is very particularly suitable for high density interconnections.

It should be noted that, for the purpose of simplicity, just one well and just one interconnection (or pathway) have been represented per connection layer but it is, of course, possible to produce more than one interconnection for a given connection layer for several conductive patterns of this connection layer which are electrically independent of one another and which it is a matter of electrically connecting to the surface of the component.

It should also be noted that the various connection layers can be positioned in a different fashion from that which has been described.

The process can also make it possible to produce, in a single stage, wells passing through at least one substrate toward at least two connection layers separated by at least one insulating layer, which wells will subsequently be simultaneously filled with a conductive material, to produce only one interconnecting portion. This portion can subsequently be supplemented, for example by subsequently producing wells aligned with the preceding wells through another substrate, which wells will subsequently be filled with conductive material in order to produce an interconnection.

The technique described makes it possible to significantly simplify the sequence of the stages of manufacture of complex MEMS or NEMS ("nanoelectromechanical system") devices comprising a stack of several substrates. In the example of FIGS. 3a to 3j, the invention makes it possible to economize on approximately 25% of the number of the stages, with respect to the state of the art, which consists in producing interconnections at each deposition/assembling of a new layer.

The invention claimed is:

1. A process for producing a conductive pathway between at least two connection layers of a component, the process comprising the steps of:
   providing a component comprising at least a first substrate and a second substrate that are arranged in a stack and are electrically insulated from one another, a first embedded connection layer that is embedded in the first substrate, at least one region devoid of material positioned between the first substrate and the second substrate, and a first insulating layer which covers the first embedded connection layer;
   defining a first embedded contact region of said first embedded connection layer;
   defining a surface contact region of a surface connection layer that is to be formed on a surface of the stack overlying said first embedded contact region;
   plasma etching the stack starting from said surface of the stack correlating to the defined surface contact region to produce a first interconnecting well which passes through at least the second substrate and which extends between the defined surface contact region and the first embedded contact region of said first embedded connection layer, and wherein the first interconnecting well passes through the region devoid of material and the first insulating layer.

2. The process as claimed in claim 1, which comprises a stage of filling the interconnecting well with a conductive material in order to form a conductive pathway and a stage of producing said surface connection layer, the conductive pathway electrically connecting, via the said contact regions thereof, the first embedded connection layer to the surface connection layer.

3. The process as claimed in claim 1, wherein the first embedded connection layer is put into a surface of the first substrate on which the first insulating layer is subsequently deposited and which comprises the following stages:
   a) after the deposition of the first insulating layer, depositing, on the latter, at least one second embedded connection layer comprising a second embedded contact region, leaving free at least one first region devoid of material for the passage of a conductive pathway intended for the first embedded contact region of the first embedded connection layer,
   b) rendering the second embedded connection layer integral with the second semiconducting substrate via a second insulating layer
   c) producing at least said first interconnecting well.

4. The process as claimed in claim 3, wherein c also comprises the production of a second interconnecting well extending from said surface of the stack as far as the second embedded contact region of the second embedded connection layer.

5. The process as claimed in claim 3, wherein stage c is carried out starting from a surface of the second substrate, opposite that in contact with said second insulating layer.

6. The process as claimed in claim 3, which comprises, between b and c:
   b1) producing, at said surface of the second substrate which is opposite said surface in contact with the second insulating layer, at least one embedded connection layer exhibiting a third embedded contact region, leaving free at least one region devoid of material situated vertically above the embedded contact regions of each of the first and second embedded connection layers,
   b2) rendering the third embedded connection layer integral with a third substrate via a third insulating layer.

7. The process as claimed in claim 6, wherein stage c) comprises the simultaneous production of at least one first interconnecting well, one second interconnecting well and/or one third interconnecting well for at least one of the first, second and third contact regions.

8. The process as claimed in claim 6, wherein stage c is carried out starting from a surface of the third substrate, opposite that in contact with said third insulating layer.

9. The process as claimed in claim 1, wherein the first embedded connection layer is put into a surface of the first substrate on which the first insulating layer is subsequently deposited and which comprises the following stages:
   a') rendering the first insulating layer integral with a first surface of a second substrate,
   b'1) producing, at the surface of the second substrate opposite its first surface, a second embedded connection layer, leaving free at least one region devoid of material situated vertically above the embedded contact region of the first embedded connection layer,
   b'2) rendering the second embedded connection layer integral with a third substrate via a third insulating layer,
   c') producing at least the first interconnecting well.

10. The process as claimed in claim 9, which also comprises the production of a second interconnecting well extending from the surface of the stack as far as the second embedded contact region.

11. The process as claimed in claim 9, wherein stage c') is carried out starting from a surface of the third substrate, opposite that in contact with said third insulating layer.

12. The process as claimed in claim 3, wherein at least one said stage of rendering integral is carried out by direct bonding.

13. The process as claimed in claim 1, wherein said substrates are rendered integral with one another by direct bonding.

14. The process as claimed in claim 1, wherein at least one region devoid of material exhibits a region devoid of material which surrounds the passage of an interconnecting well.

15. The process as claimed in claim 1, wherein at least one region devoid of material is bordered at its periphery by a conductive region surrounding the passage of an interconnecting well, this conductive region being electrically insulated with the filling stage.

16. The process as claimed in claim 1, which comprises a single stage of filling the interconnecting wells with an electrically conductive material in order to produce said interconnections.

17. A process for producing a conductive pathway between at least two connection layers of a component, the process comprising the steps of:
   providing a component comprising a first substrate and a second substrate that are arranged in a stack and are electrically insulated from one another, a first embedded connection layer that is embedded in the first substrate, at least one region devoid of material positioned between the first substrate and the second substrate, and a first insulating layer which covers the first embedded connection layer;

plasma etching the stack starting from said surface of the stack to produce a first interconnecting well which passes through at least the second substrate and which extends between the surface of the second substrate and a first embedded contact region of said first embedded connection layer, and wherein the first interconnecting well passes through the region devoid of material and the first insulating layer.

18. The process as claimed in claim 17, comprises a stage of filling the interconnecting well with a conductive material in order to form a conductive pathway and a stage of producing a surface connection layer, the conductive pathway electrically connecting a first embedded contact region of the first embedded connection layer to the surface connection layer.

19. The process as claimed in claim 17, wherein the first embedded connection layer is put into a surface of the first substrate on which the first insulating layer is subsequently deposited and which comprises the following stages:
a) after the deposition of the first insulating layer, depositing, on the latter, at least one second embedded connection layer comprising a second embedded contact region, leaving free at least one first region devoid of material for the passage of a conductive pathway intended for the first embedded contact region of the first embedded connection layer,
b) rendering the second embedded connection layer integral with the second semiconducting substrate via a second insulating layer
c) producing at least said first interconnecting well.

20. The process as claimed in claim 19, wherein step c) also comprises the production of a second interconnecting well extending from said surface of the stack to the second embedded connection layer.

* * * * *